United States Patent
Hshieh

(10) Patent No.: US 7,863,685 B2
(45) Date of Patent: Jan. 4, 2011

(54) TRENCH MOSFET WITH EMBEDDED JUNCTION BARRIER SCHOTTKY DIODE

(75) Inventor: Fwu-Iuan Hshieh, Saratoga, CA (US)

(73) Assignee: Force-MOS Technology Corp. (TW)

( * ) Notice: Subject to any disclaimer, the term of this patent is extended or adjusted under 35 U.S.C. 154(b) by 203 days.

(21) Appl. No.: 12/156,070

(22) Filed: May 28, 2008

(65) Prior Publication Data
US 2009/0294859 A1    Dec. 3, 2009

(51) Int. Cl.
*H01L 29/76* (2006.01)
(52) U.S. Cl. .............. 257/368; 257/301; 257/330; 257/E21.085
(58) Field of Classification Search ......... 257/329–330, 257/263, 301, 368, 570; 438/242, 259, 270
See application file for complete search history.

(56) References Cited

U.S. PATENT DOCUMENTS

2007/0290234 A1* 12/2007 Wu .............................. 257/212
2008/0265289 A1* 10/2008 Bhalla et al. ................. 257/263

* cited by examiner

*Primary Examiner*—Dung A. Le
(74) *Attorney, Agent, or Firm*—Bo-In Lin

(57) ABSTRACT

A trenched semiconductor power device that includes a plurality of trenched gates surrounded by source regions near a top surface of a semiconductor substrate encompassed in body regions. Each of the body regions extended between two adjacent trenched gates further having a gap exposing a top surface above an epitaxial layer above said semiconductor substrate. The trenched semiconductor power device further includes a Schottky junction barrier layer covering the top surface above the epitaxial layer between the trenched gate thus forming embedded Schottky diodes between adjacent trenched gates.

19 Claims, 10 Drawing Sheets

TRENCH MOSFET WITH EMBEDDED JUNCTION BARRIER SCHOTTKY DIODE

BACKGROUND OF THE INVENTION

1. Field of the Invention

The invention relates generally to the device configuration and manufacturing methods for fabricating the semiconductor power devices. More particularly, this invention relates to an improved device configuration for providing the MOSFET device with embedded junction barrier Schottky diode above split body regions to improve operation efficiency with reduced areas occupied by the Schottky diodes while reducing reverse current because of current pinch-off of the adjacent body regions.

2. Description of the Related Art

In order to increase the efficiency of a semiconductor power device, a Schottky diode is often implemented as a clamping diode in parallel to the parasitic PN body diode to prevent the body diode from turning on. Once the parasitic PN body diode is turned on, both electron and hole carriers are generated that requires longer time to eliminate these carriers through the electron-hole combinations. The Schottky diode is implemented to prevent the turning-on of the parasitic PN diode and furthermore, the Schottky diode is operated with a single carrier, e.g., the carriers consisted of electrons only, and these single type of carriers can be drawn from the drain electrode. Therefore, Schottky diode is an effective and preferred clamping diode to increase the operational efficiency of the semiconductor power device. The Schottky clamping operation can be realized when the forward Vf voltage of the Schottky diode is less than the parasitic diode that is approximately 0.7 volts. Furthermore, the Schottky diode must have a low reverse current that is generally lower than ten milliamperes (mA).

A typical application of the Schottky diode in a semiconductor power device is shown in FIG. 1A that illustrates the application of a semiconductor power device, e.g., a MOSFET is a high efficiency DC/DC converter. A Schottky diode is externally added in parallel with the MOSFET device to prevent the parasitic PN diode of the MOSFET from inadvertently turn on thus increase the operational efficiency of the DC/DC converter. However, the implementation of an external Schottky diode increases the size of the DC/DC converter and also requires additional manufacturing processes to connect the external Schottky to the MOSFET. An integration of the Schottky diode with the semiconductor power device as a single integrated circuit (IC) chip is certainly more desirable for simplifying the manufacturing processes and to reduce the size and costs of the semiconductor power device.

In U.S. Pat. No. 6,351,018, Sapp discloses a trench MOSFET implemented with trench Schottky diodes as shown in FIG. 1B. The trench Schottky diodes as disclosed by Sapp however occupy additional space that is approximately the same size as the MOSFET device itself. Furthermore, the trench Schottky diode suffers an disadvantage the there is a high leakage current between the drain and the source due to the increase of the phosphorous dopant concentration at the channel regions with the dopant ions diffuse to the channel regions during the sacrificial and gate oxidation processes. The Schottky diodes as disclosed further have higher capacitance due to the present of the MOS structure.

Kinzer discloses another semiconductor power device in U.S. Pat. No. 6,433,396 implemented with planar Schottky diodes as shown in FIG. 1C. The planar Schottky diodes are formed in a separate planar Schottky diode area. Again, the configuration requires a larger area due to the additional space occupied by the planar Schottky diodes. Furthermore, one additional contact mask is required to form the planar Schottky diodes in the specially assigned area for the planar Schottky diodes. The production cost is increased due to the additional mask requirement. Moreover, the leakage current of the embedded planar Schottky diodes are much higher than the trench Schottky diodes and conventional Junction barrier diodes.

In U.S. Pat. No. 6,998,678, Werner et al. disclose anther semiconductor power device implemented with trench Schottky diodes as shown in FIG. 1D. The trench Schottky diodes are formed adjacent to and in parallel to the trench gates in the semiconductor substrate. Each Schottky diode is connected in parallel with a drain-source path (D-S) and is formed by a Schottky contact between a source electrode and the semiconductor body near the bottom of the trenches parallel to the trench gates. The device disclosed by Werner still suffers the disadvantage that additional spaces are occupied by the trench Schottky diodes and furthermore, additional P+ mask is required to form the Schottky diodes.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device by forming a semiconductor power device integrated with embedded Schottky diodes by forming a barrier junction layer between the trenched gates above a split body region to form the Schottky diodes above an epitaxial layer between the split body regions. More compact configuration is achieved without requiring expansion of the space between the trench gate to accommodate the Schottky diodes. The pinch off of the reverse current by the split gate below the Schottky diodes further reduces the reverse currents. The technical limitations of requiring additional space for the Schottky diodes and the disadvantages of requiring additional mask for making the Schottky diodes as encountered by the prior art are therefore resolved.

Another aspect of this invention is to new and improved semiconductor power device by forming either a trench MOSFET power device integrated with embedded Schottky diodes by forming a barrier junction layer between the trench gates above a split body region to form the Schottky diodes above an epitaxial layer between the split body regions. In an exemplary embodiment Schottky diodes are in electrical contact with a planar source contact metal physically contacting the source and body region from the top surface area of the epitaxial layer between the two adjacent gate oxide layers that insulates the trench gates. In another exemplary embodiment, the source contact layer is further in physical contact with the source regions through a top portion of the sidewalls above the trenched gate whereby additional contact areas are provided to prevent design and operation difficulties caused by current crowding due to narrow down source/body contact areas between the trenched gates.

Another aspect of this invention is to new and improved semiconductor power device by forming either a trench MOSFET power device integrated with embedded Schottky diodes by forming a barrier junction layer between the trench gates above a split body region to form the Schottky diodes above an epitaxial layer between the split body regions. In an exemplary embodiment trenched gates are padded with an oxide layer of substantially uniform thickness. In another embodiment, the trenched gates are padded with a thicker gate oxide on the trench bottom and thinner gate oxide layer along the trench sidewalls.

Briefly in a preferred embodiment, this invention discloses a trenched semiconductor power device comprising a plurality of trenched gates surrounded by source regions near a top surface of a semiconductor substrate encompassed in body regions. Each of the body regions extended between two adjacent trenched gates further having a gap exposing a top surface above an epitaxial layer above said semiconductor substrate. The trenched semiconductor power device further includes a Schottky junction barrier layer covering the top surface above the epitaxial layer between the trenched gate thus forming embedded Schottky diodes between adjacent trenched gates. The semiconductor power device further includes a source contact metal layer above and in contact with the Schottky diodes and the source and body regions of the semiconductor power device. In an exemplary embodiment, the Schottky junction barrier layer comprises a cobalt silicide layer. In another exemplary embodiment, the Schottky junction barrier layer comprises a titanium silicide layer. In another exemplary embodiment, the Schottky junction barrier layer comprises a tungsten silicide layer. In another exemplary embodiment, the Schottky junction barrier layer comprises a platinum silicide layer. In another exemplary embodiment, the source contact metal extended to a top portion of the trenched gates with exposed sidewalls exposing source regions for further contacting the source contact metal in addition to the source metal contact on the top surface of the semiconductor substrate. In another exemplary embodiment, the trenched gate comprising polysilicon layer filled in a plurality of trenches padded with a gate insulation layer having a substantially uniform thickness. In another exemplary embodiment, the trenched gate comprising polysilicon layer filled in a plurality of trenches padded with a gate insulation layer having a greater thickness on a bottom surface of the trenches than the gate insulation layer padded along sidewalls of the trenches.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
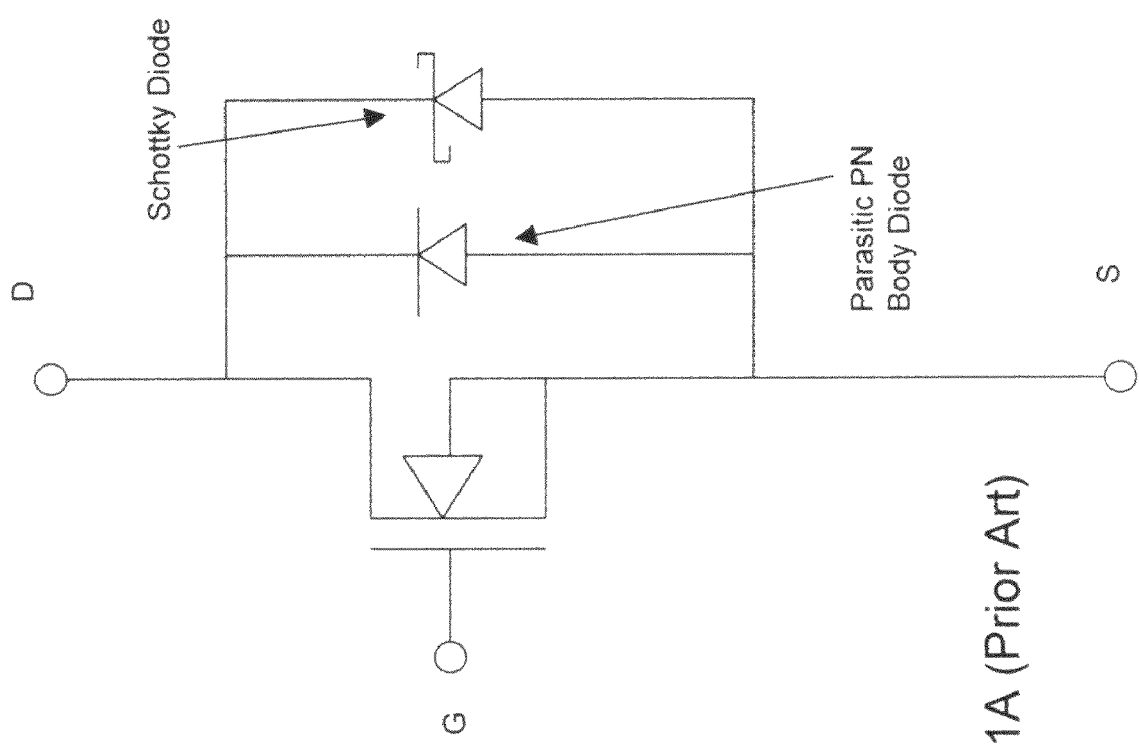
FIG. 1 is a circuit diagram for illustrating the functions of the Schottky diodes connecting to a semiconductor power device to increase the operational efficiency of the semiconductor power device.
FIG. 1B to 1D are cross sectional views of different conventional trenched MOSFET power devices with integrated Schottky diodes integrated as part of an IC chip.
Figure 1B:
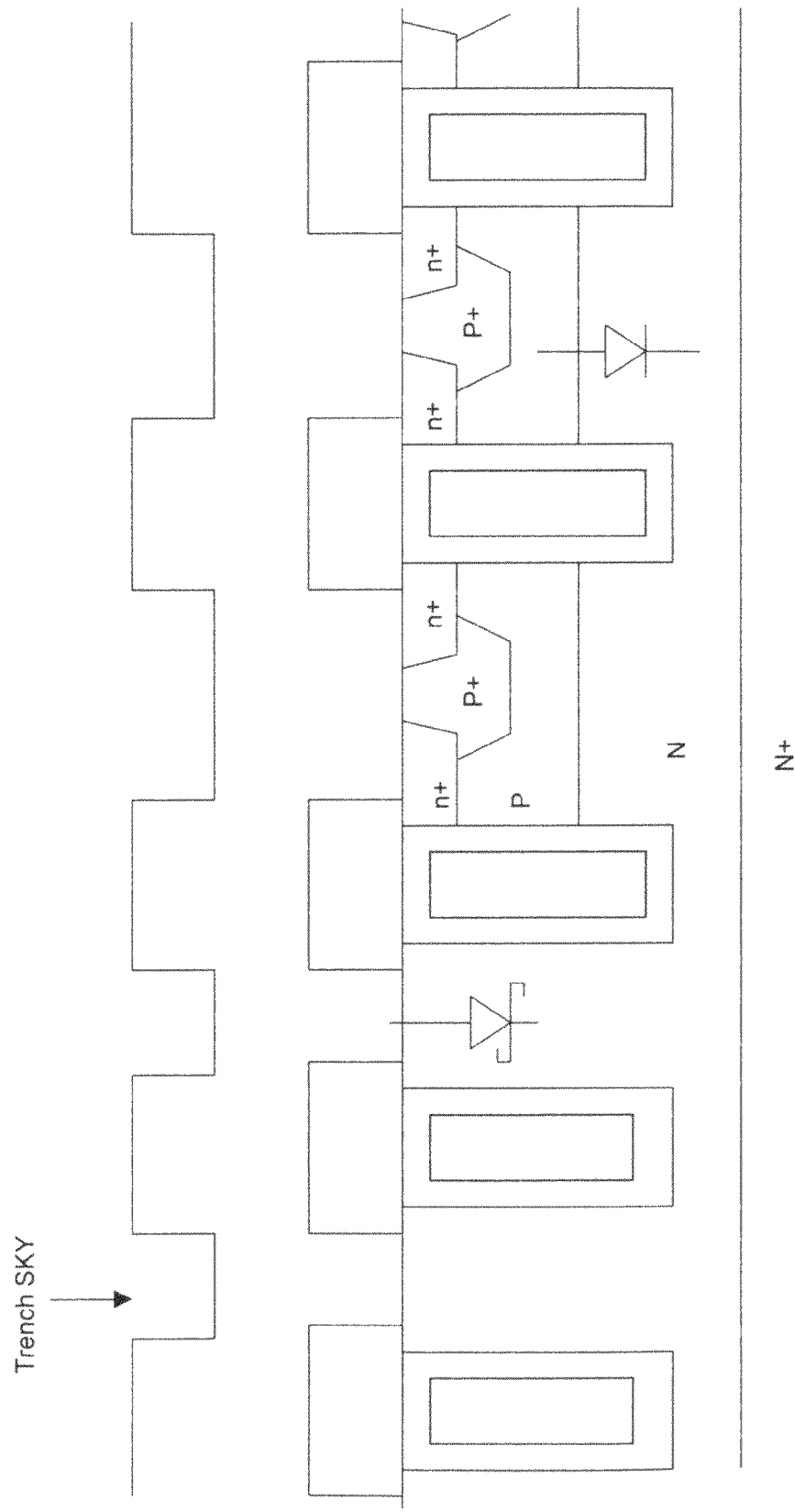
Figure 1C:
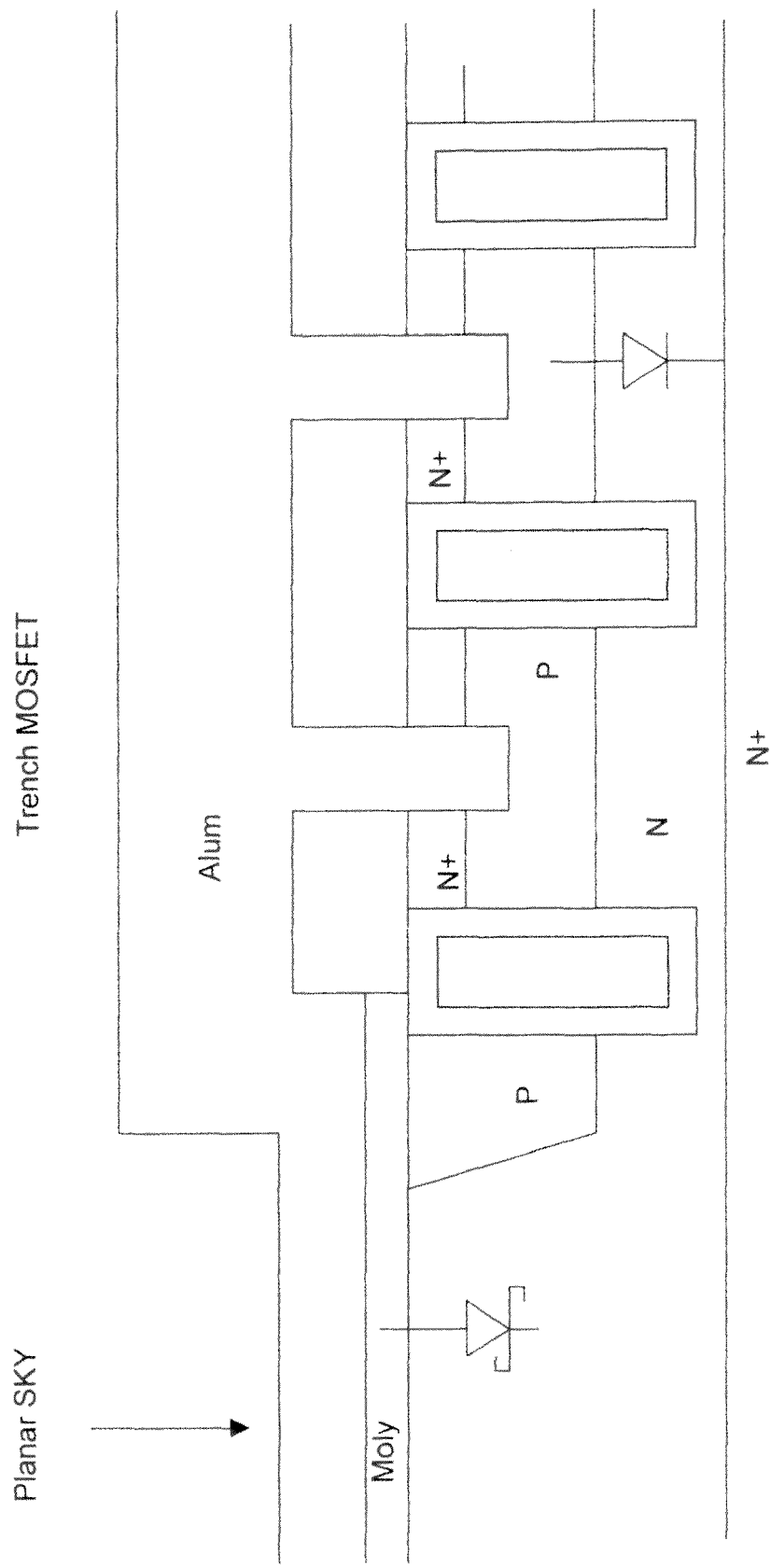
Figure 1D:
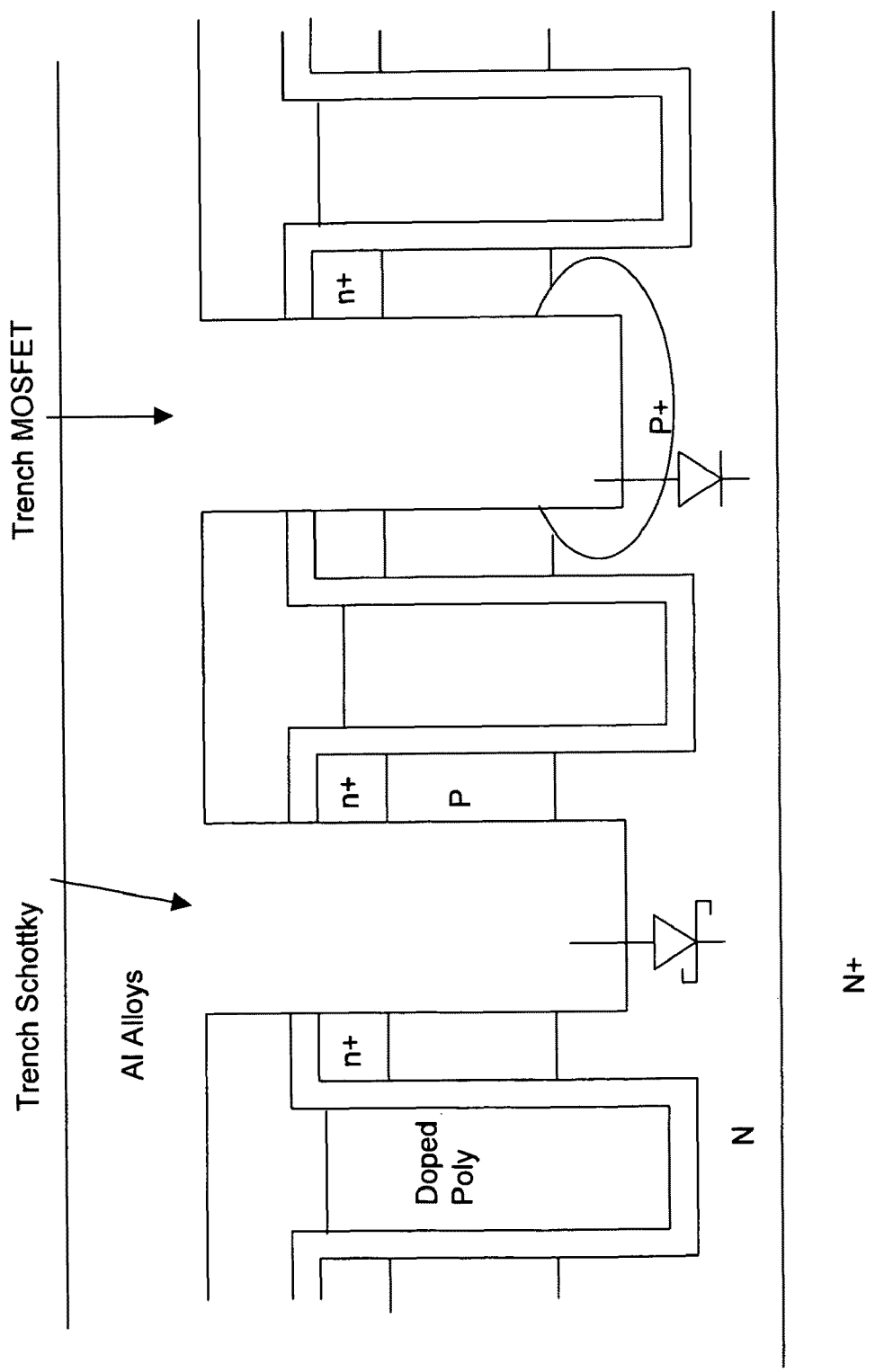
Figure 2:
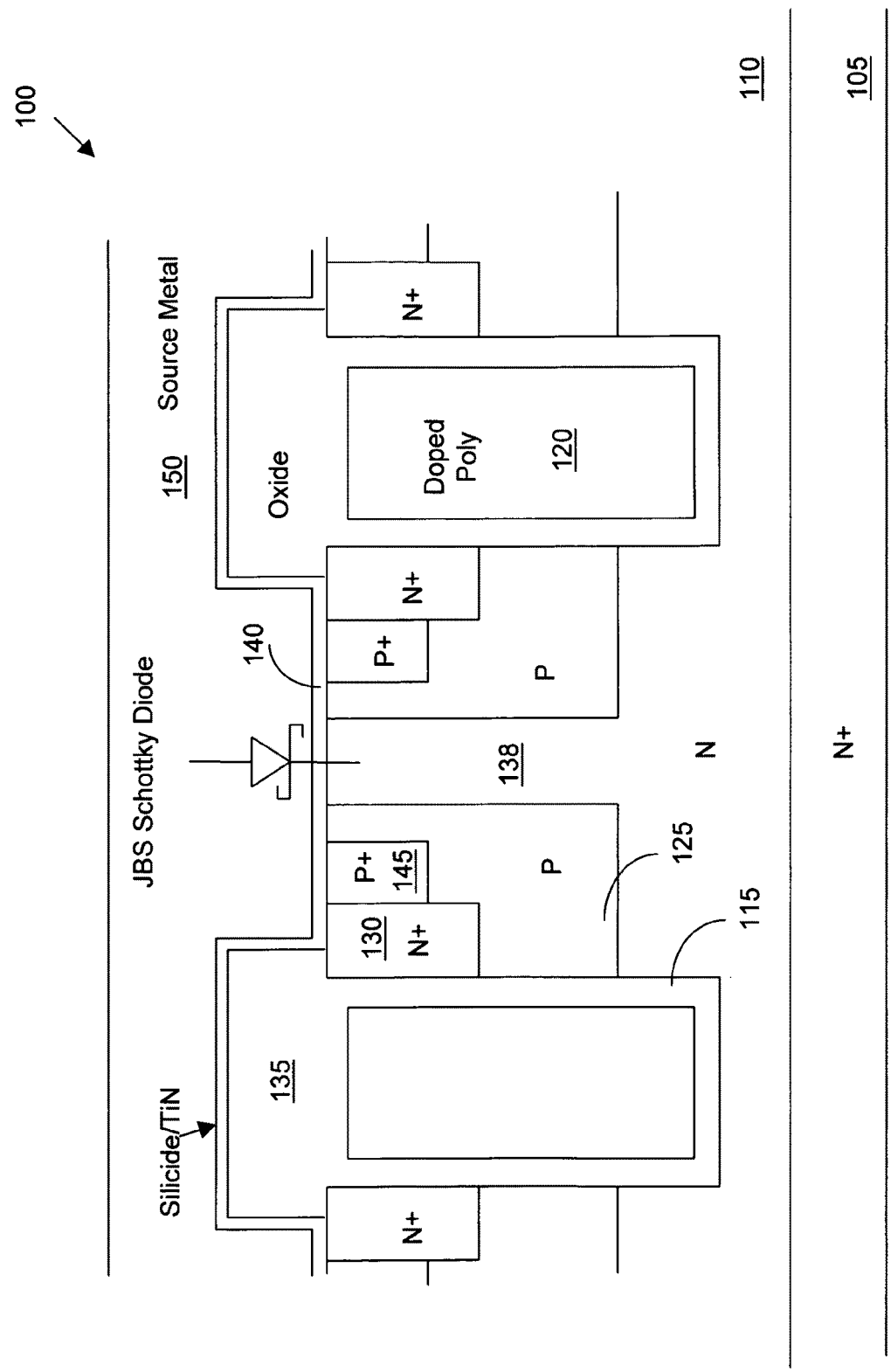
FIGS. 2 to 7 are six alternate embodiments of the present invention of a MOSFET device implemented with embedded Schottky diodes between adjacent trenched gates above the epitaxial layer exposed between split body regions thus reducing areas required for the Schottky diodes.

Referring to FIG. 2 for a side cross sectional view of a MOSFET device 100 formed on a N+ substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 and covered by an insulation layer, e.g., an oxide layer 135. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The source metal 150 thus forming a surface contact to the source body regions as a two-dimensional (2D) contact, i.e., a X-Z two dimensional contact wherein the X-axis is along the line on top of the N and P+ regions and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes during reverse bias.

Figure 3:
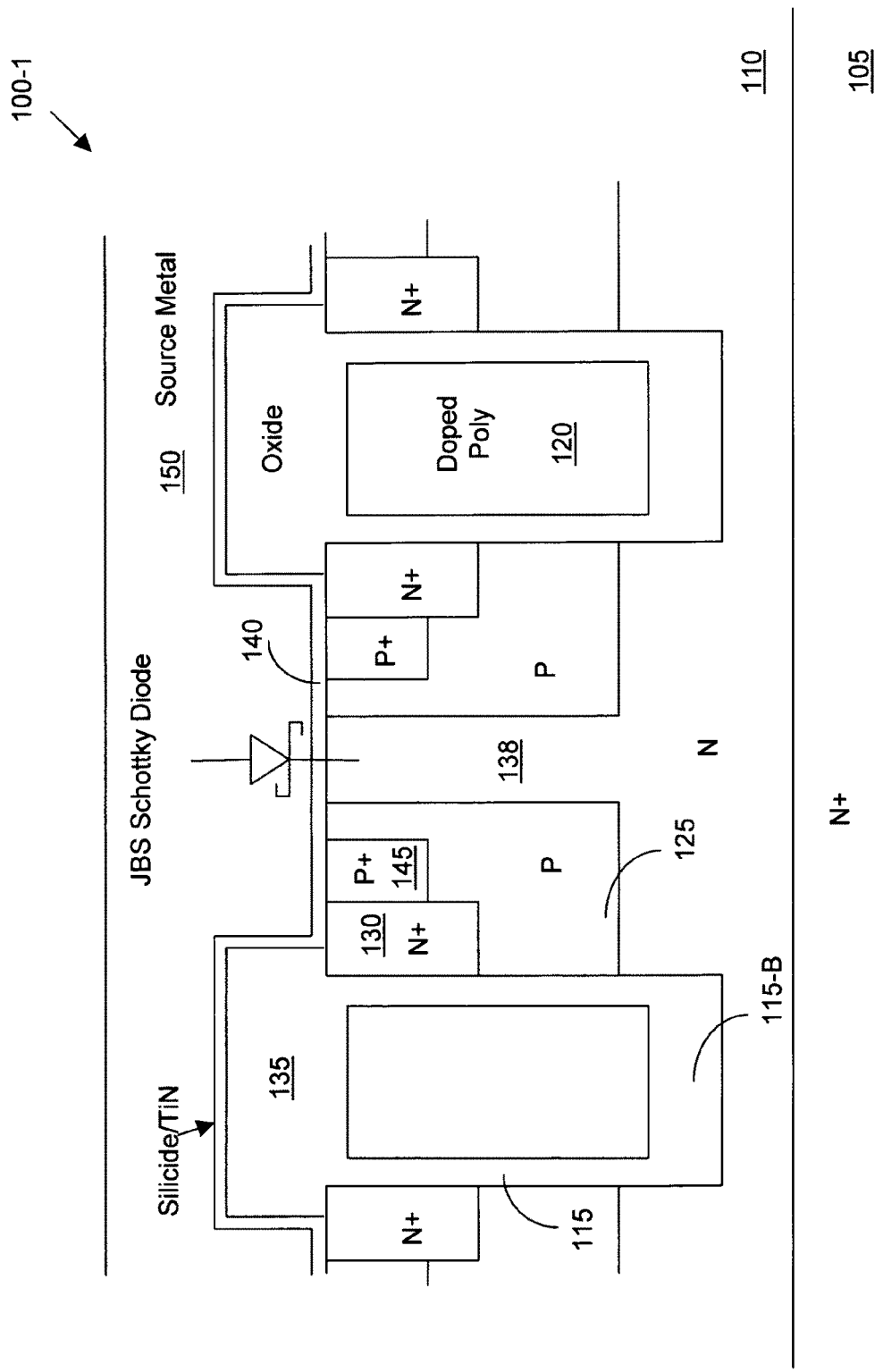

Referring to FIG. 3 for a side cross sectional view of another MOSFET device 100-1 as a second embodiment formed on a N+substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 on the sidewalls and a thicker bottom gate oxide layer 115-B. An insulation layer, e.g., an oxide layer 135, further covers the trenched gates. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The source metal 150 thus forming a surface contact to the source body regions as a two-dimensional (2D) contact, i.e., a X-Z two dimensional contact wherein the X-axis is along the line on top of the N and P+ regions and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes during reverse bias.

Figure 4:
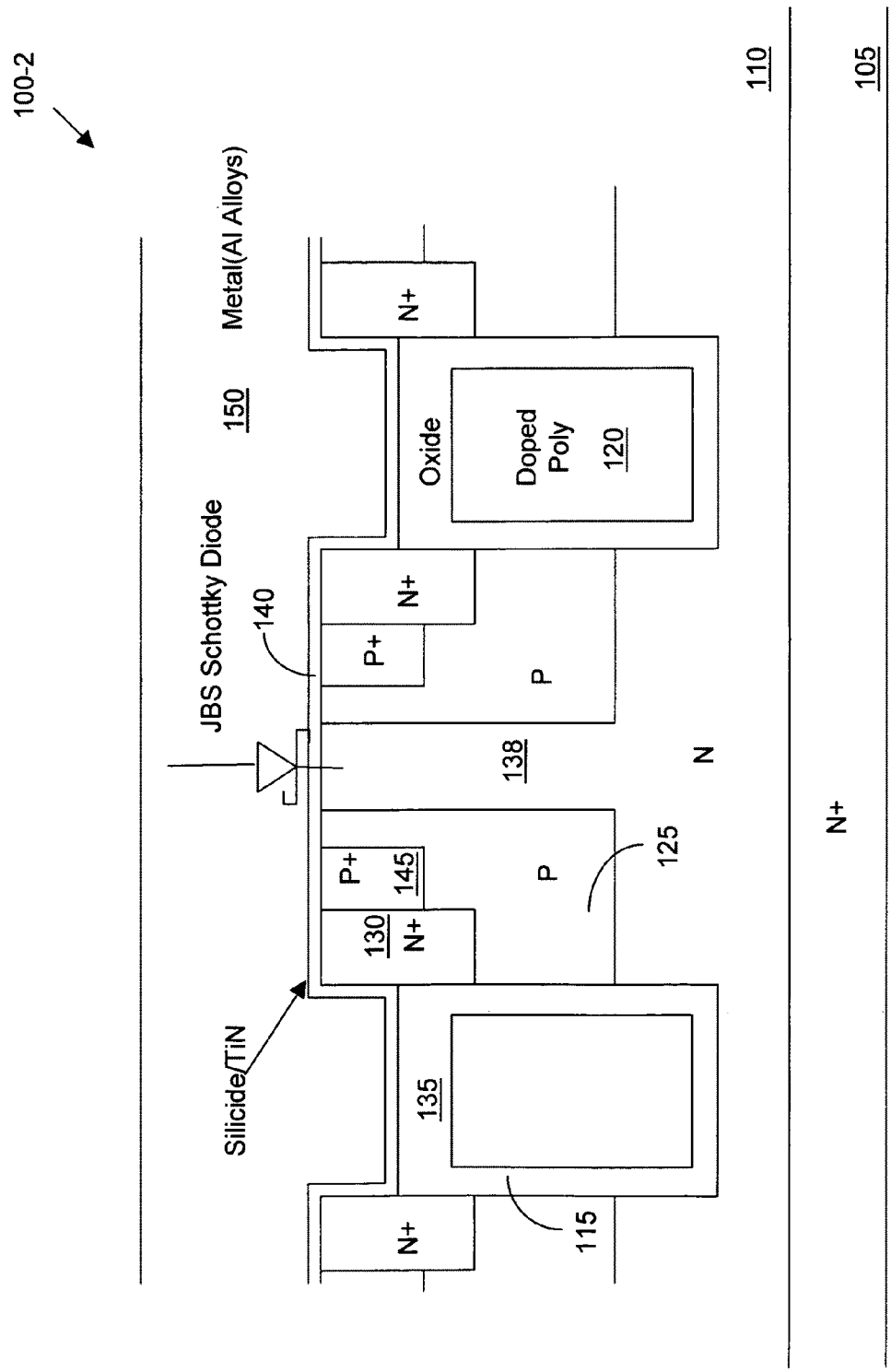

Referring to FIG. 4 for a side cross sectional view of another MOSFET device 100-2 as a third embodiment formed on a N+ substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 on the sidewalls and on the bottom surface.

An insulation layer, e.g., an oxide layer 135, further fills a top portion of the trenches with a portion of the trench sidewalls exposed to the source regions 130. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The silicide/TiN metal covered by the source metal 150 are extended into the top portion of the trenches above the top gate oxide layer 135 to contact the source regions 130 through the trench sidewalls. The source metal 150 therefore forms a surface contact to the source body regions on a top surface between two adjacent trenched gates and further along a vertical direction along the trench sidewalls thus forming a three-dimensional (3D) contact, i.e., a X, Y, Z three dimensional contact wherein the X-axis is along the line on top of the N and P+ regions, the Y axis is along the vertical sidewall and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes. The source contact layer 150 has expanded contact areas through the trench sidewalls thus prevents current crowding effect. Because the additional trench sidewall contact to N+ 130, the current flow from drain to source metal 150 through channel region will be split into two groups: one is through trench sidewall contact and another is through the surface contact. The problems of current crowding can be prevented. Specifically, a current crowding effect will create accumulated thermal heating issue near channel region, Rds is hence significantly increased at high current level due to reduction in electron mobility at high temperature. With the three-dimensional contact surfaces, the problems that may arise from a current crowding configuration are therefore prevented.

Figure 5:
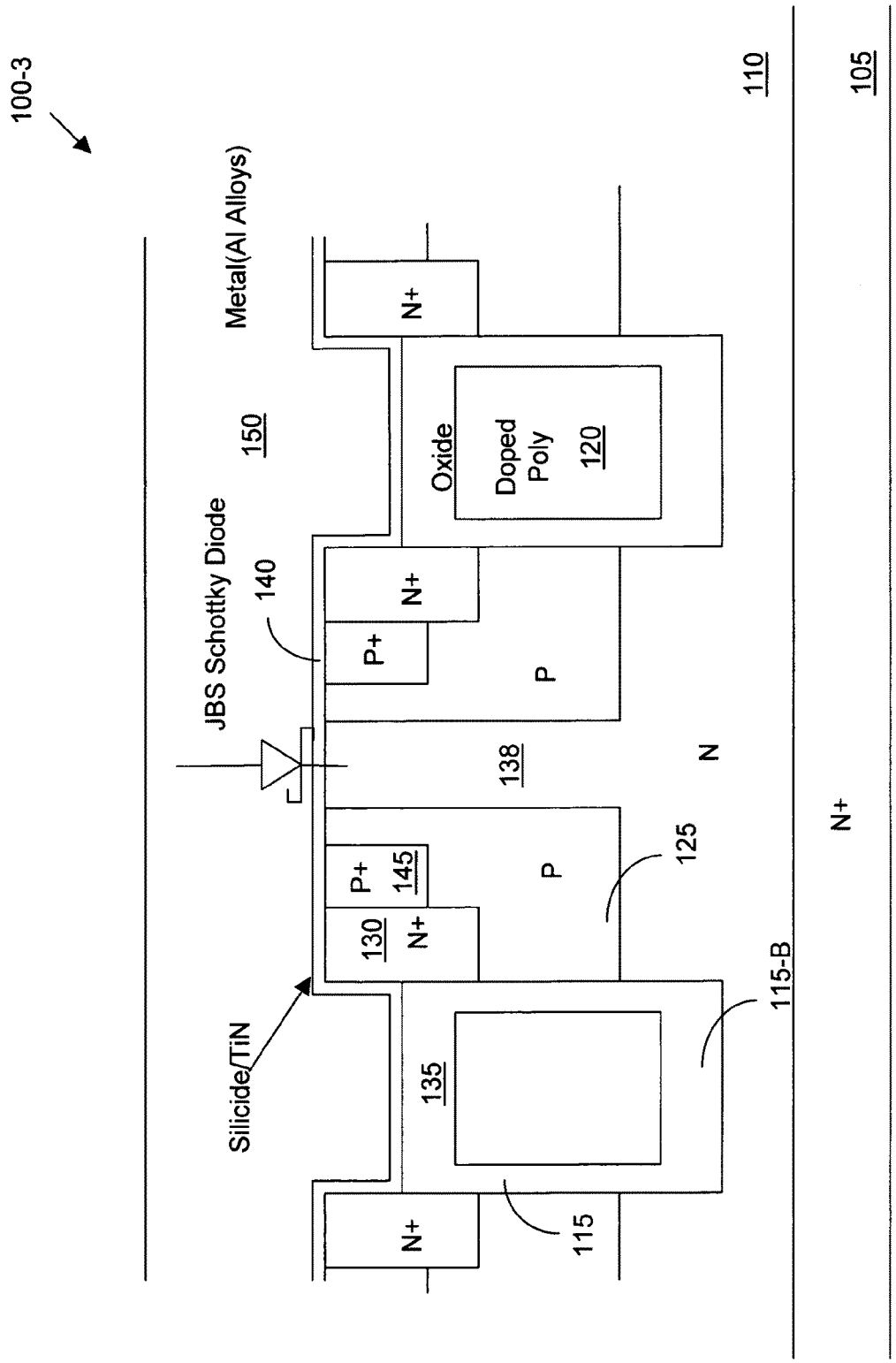

Referring to FIG. 5 for a side cross sectional view of another MOSFET device 100-3 as a fourth embodiment formed on a N+ substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 on the sidewalls and a thicker bottom gate oxide layer 115-B. An insulation layer, e.g., an oxide layer 135, further fills a top portion of the trenches with a portion of the trench sidewalls exposed to the source regions 130. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The silicide/TiN metal covered by the source metal 150 are extended into the top portion of the trenches above the top gate oxide layer 135 to contact the source regions 130 through the trench sidewalls. The source metal 150 therefore forms a surface contact to the source body regions on a top surface between two adjacent trenched gates and further along a vertical direction along the trench sidewalls thus forming a three-dimensional (3D) contact, i.e., a X, Y, Z three dimensional contact wherein the X-axis is along the line on top of the N and P+ regions, the Y axis is along the vertical sidewall and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes. The source contact layer 150 has expanded contact areas through the trench sidewalls thus prevents current crowding effect. Because the additional trench sidewall contact to N+ 130, the current flow from drain to source metal 150 through channel region will be split into two groups: one is through trench sidewall contact and another is through the surface contact. The problems of current crowding can be prevented. Specifically, a current crowding effect will create accumulated thermal heating issue near channel region, Rds is hence significantly increased at high current level due to reduction in electron mobility at high temperature. With the three-dimensional contact surfaces, the problems that may arise from a current crowding configuration are therefore prevented.

Figure 6:
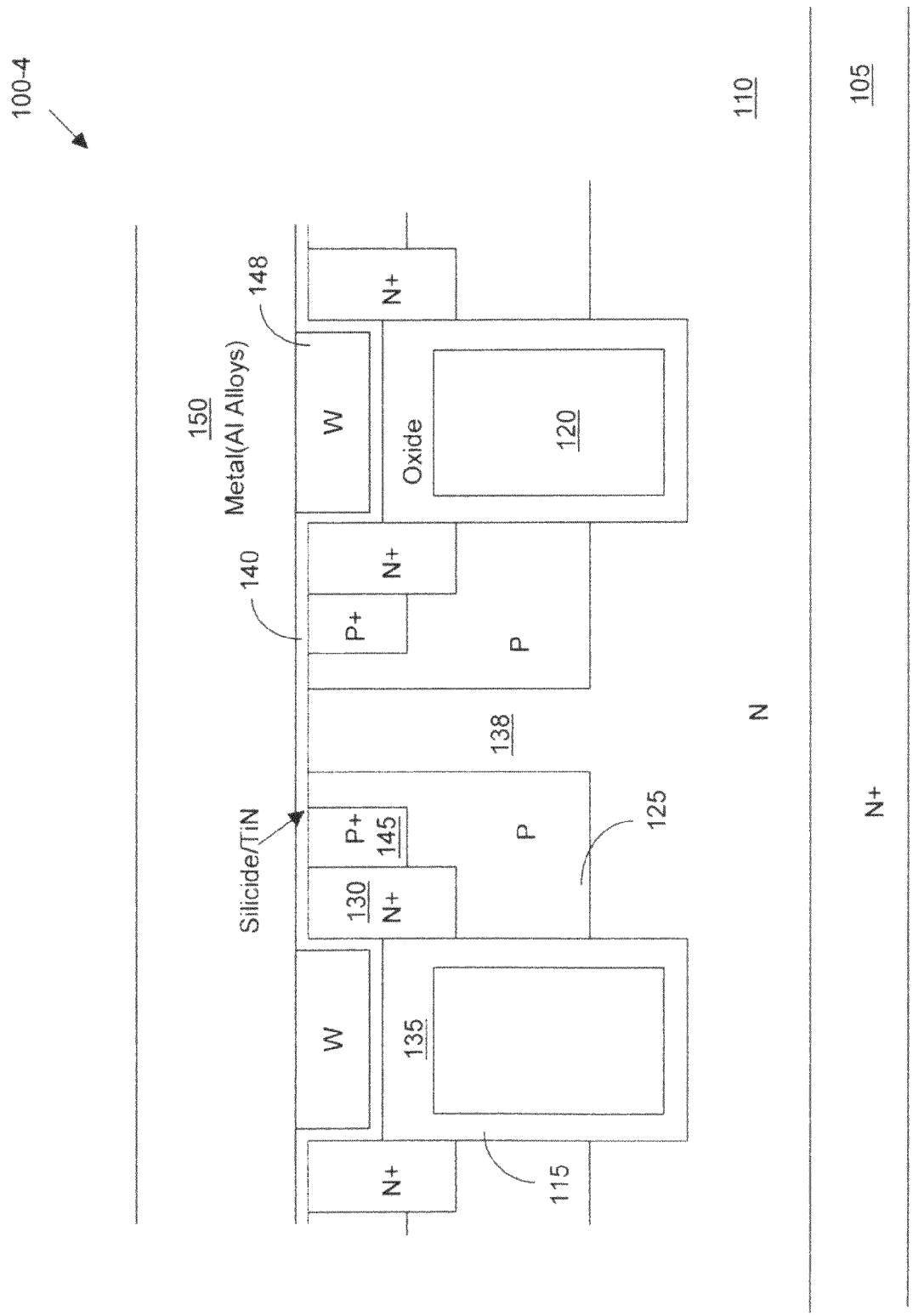

Referring to FIG. 6 for a side cross sectional view of another MOSFET device 100-4 as a fifth embodiment formed on a N+ substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 on the sidewalls and on the bottom surface of the trenches. An insulation layer, e.g., an oxide layer 135, further fills a part of the top portion of the trenches with a portion of the trench sidewalls exposed to the source regions 130. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The silicide/TiN metal covered by the source metal 150 are extended into the top portion of the trenches above the top gate oxide layer 135 to contact the source regions 130 through the trench sidewalls. A top portion above the silicide/TiN layer 140 is filled with a tungsten layer 148. The source metal 150 therefore forms a surface contact to the source body regions on a top surface between two adjacent trenched gates and further along a vertical direction along the trench sidewalls thus forming a three-dimensional (3D) contact, i.e., a X, Y, Z three dimensional contact wherein the X-axis is along the line on top of the N and P+ regions, the Y axis is along the vertical sidewall and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes. The source contact layer 150 has expanded contact areas through the trench sidewalls thus prevents current crowding effect. Because the additional trench sidewall contact to N+ 130, the current flow from drain to source metal 150 through channel region will be split into two groups: one is through trench sidewall contact and another is through the surface contact. The problems of current crowding can be prevented. Specifically, a current crowding effect will create accumulated thermal heating issue near channel region, Rds is hence significantly increased at high current level due to reduction in electron mobility at high temperature. With the three-dimensional contact surfaces, the problems that may arise from a current crowding configuration are therefore prevented.

Figure 7:
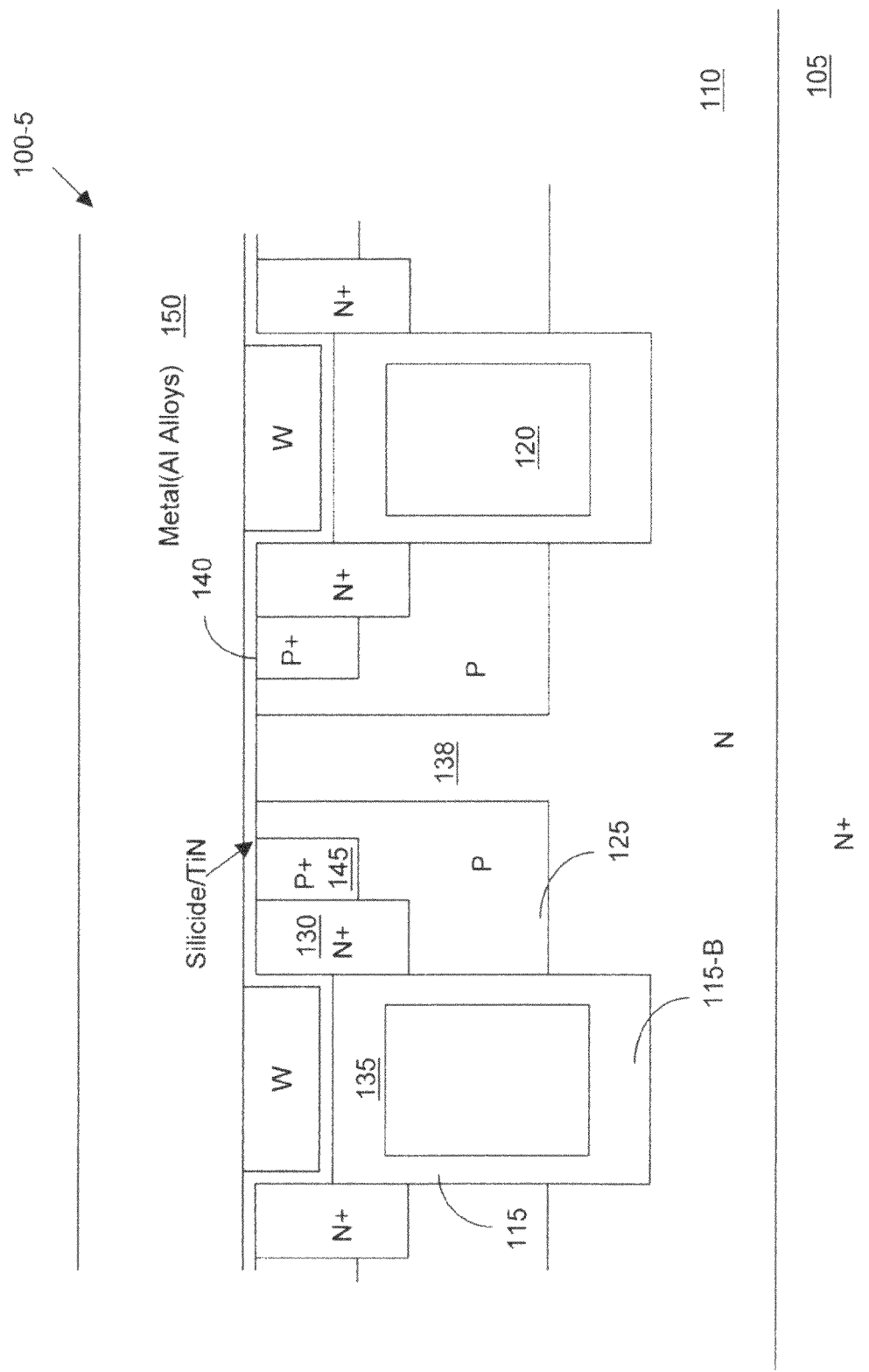

Referring to FIG. 7 for a side cross sectional view of another MOSFET device 100-5 as a sixth embodiment formed on a N+ substrate 105 supporting an N-epitaxial layer 110. The MOSFET device further includes a plurality of trenched polysilicon gates 120. In the epitaxial layer 110, the P-body region 125 encompasses the source region 130 therein surrounding the trenched gate 120 near the top surface of the substrate. The trenched gates 120 are padded with a gate oxide layer 115 on the sidewalls and a thicker bottom gate oxide layer 115-B. An insulation layer, e.g., an oxide layer 135, further fills a part of the top portion of the trenches with a portion of the trench sidewalls exposed to the source regions 130. The P-body regions are formed as split bodies with an N-epitaxial junction barrier Schottky open region 138 formed in the middle portion between two adjacent trenched gates 120. The top surface between two adjacent gates is covered with a silicide/TiN metal layer 140 and covered by a source metal 150. The silicide/TiN metal covered by the source metal 150 are extended into the top portion of the trenches above the top gate oxide layer 135 to contact the source regions 130 through the trench sidewalls. A top portion above the silicide/TiN layer 140 is filled with a tungsten layer 148. The source metal 150 therefore forms a surface contact to the source body regions on a top surface between two adjacent trenched gates and further along a vertical direction along the trench sidewalls thus forming a three-dimensional (3D) contact, i.e., a X, Y, Z three dimensional contact wherein the X-axis is along the line on top of the N and P+ regions, the Y axis is along the vertical sidewall and the Z-axis is a perpendicular axis into the paper. A junction barrier Schottky (JBS) diode is formed between the barrier silicide/TiN metal layer 140 and the N-epitaxial layer 110 underneath. In order to reduce contact resistance between the split bodies 125 and the silicides 140, and improve device ruggedness for prevention of parasitic bipolar N+PN from turning on, the P+ doped regions 145 are formed next to the source region 130 in the P-body regions 125. The embedded JBS Schottky diodes are therefore formed between the split body regions to save space. The reverse current is reduced with the pinch-off of the two adjacent P-body regions 125 surrounding the JBS Schottky diodes. The source contact layer 150 has expanded contact areas through the trench sidewalls thus prevents current crowding effect. Because the additional trench sidewall contact to N+ 130, the current flow from drain to source metal 150 through channel region will be split into two groups: one is through trench sidewall contact and another is through the surface contact. The problems of current crowding can be prevented. Specifically, a current crowding effect will create accumulated thermal heating issue near channel region, Rds is hence significantly increased at high current level due to reduction in electron mobility at high temperature. With the three-dimensional contact surfaces, the problems that may arise from a current crowding configuration are therefore prevented.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A trenched semiconductor power device comprising a plurality of trenched gates surrounded by source regions near a top surface of a semiconductor substrate encompassed in body regions covered under an insulation layer, wherein:
   each of the body regions extended between two adjacent trenched gates further having a split-body gap exposing a top surface above an epitaxial layer above said semiconductor substrate;
   said trenched gates are partially filled with a polysilicon therein and having a top insulation layer covering over a top surface of said polysilicon in said trenched gate and further exposing a portion of upper trench sidewalls adjacent to said source regions;
   Schottky junction barrier layer covering the top surface above the epitaxial layer between the trenched gate thus forming embedded Schottky diodes above said split-body gap between adjacent trenched gates; and
   said Schottky junction barrier layer further extending above the top insulation layer in said trenched gate and covering said upper trench sidewalls of said trenched gates wherein said Schottky junction barrier layer is in direct contact with said source region through said upper trench sidewalls and top surface of said source region for expanding three-dimensional (3D) current conducting surfaces to said source regions.

2. The trenched semiconductor power device of claim 1 further comprising:
   a source metal layer disposed above and in contact with the Schottky diodes and the source and body regions of the semiconductor power device.

3. The trenched semiconductor power device of claim 1 wherein:
   said Schottky junction barrier layer comprises a cobalt silicide layer.

4. The trenched semiconductor power device of claim 1 wherein:
   the Schottky junction barrier layer comprises a titanium silicide layer.

5. The trenched semiconductor power device of claim 1 wherein:
   the Schottky junction barrier layer comprises a tungsten silicide layer.

6. The trenched semiconductor power device of claim 1 wherein:
   the Schottky junction barrier layer comprises a platinum silicide layer.

7. The trenched semiconductor power device of claim 1 wherein:
   said trenched gates partially filled with said polysilicon therein and each of said trenched gates is further padded with a gate insulation layer covering a lower portion of said trenched sidewalls below said upper trench sidewalls having a substantially uniform thickness.

8. The trenched semiconductor power device of claim 1 wherein:
said trenched gates partially filled with said polysilicon therein and each of said trenched gates is padded with a gate insulation layer covering a lower portion of said trenched sidewalls below said upper trench sidewalls having a greater thickness on a bottom surface of the trenches than the gate insulation layer padded along sidewalls of the trenches.

9. The trenched semiconductor power device of claim 1 wherein:
said trenched gates partially filled with said polysilicon therein and each of said trenched gates is padded with a gate insulation layer covering a lower portion of said trenched sidewalls below said upper trench sidewalls having a substantially uniform thickness; and
said Schottky junction barrier layer is covered by an aluminum alloys source metal layer.

10. The trenched semiconductor power device of claim 1 wherein:
said trenched gates partially filled with said polysilicon therein and each of said trenched gates is padded with a gate insulation layer covering a lower portion of said trenched sidewalls below said upper trench sidewalls having a greater thickness on a bottom surface of the trenches than the gate insulation layer padded along sidewalls of the trenches; and
said Schottky junction barrier layer is covered by an aluminum alloys source metal layer.

11. The trenched semiconductor power device of claim 1 further comprising:
a higher-concentration body-dopant region disposed next to said source region encompassed in each of the body regions for reducing a contact resistance of the body regions each with said split-body gap and improving a device ruggedness.

12. The trenched semiconductor power device of claim 1 further comprising:
a higher-concentration body-dopant region disposed next to said source region in each of the body regions for reducing a contact resistance of the body regions each with said split-body gap and improving a device ruggedness; and
said Schottky junction barrier layer is covered by an aluminum alloys source metal layer.

13. The trenched semiconductor power device of claim 11 wherein:
said trenched gates partially filled with the polysilicon therein and each of said trenched gates is padded with a gate insulation layer covering a lower portion of said trenched sidewalls below said upper trench sidewalls having a substantially uniform thickness.

14. The trenched semiconductor power device of claim 11 wherein:
said trenched gates partially filled with the polysilicon therein and each of said trenched gates is padded with a gate insulation layer covering a lower portion of said trenched sidewalls below said upper trench sidewalls having a greater thickness on a bottom surface of the trenches than the gate insulation layer padded along sidewalls of the trenches.

15. The trenched semiconductor power device of claim 1 wherein:
said trenched gates partially filled with said polysilicon therein and each of said trenched gates is padded with a gate insulation layer covering a lower portion of said trenched sidewalls below said upper trench sidewalls having a substantially uniform thickness; and
a tungsten metal layer disposed in said trenched gates above said Schottky junction barrier layer filling up upper portion of said trenched gates partially filled by said polysilicon.

16. The trenched semiconductor power device of claim 15 wherein:
said Schottky junction barrier layer and said tungsten layer filling in said trenched gates are covered by an aluminum alloys source metal layer.

17. A semiconductor power device comprising:
a body region extended between two adjacent trenched gates wherein said body region further having a split-body gap exposing a top surface above an epitaxial layer above a semiconductor substrate;
said trenched gates are partially filled with a polysilicon therein and having a top insulation layer covering over a top surface of said polysilicon in said trenched gate and further exposing a portion of upper trench sidewalls adjacent to source regions encompassed in said body regions;
Schottky junction barrier layer covering the top surface above the epitaxial layer between the trenched gate thus forming embedded Schottky diodes above said split-body gap between adjacent gates; and said Schottky junction barrier layer further extending above the top insulation layer in said trenched gate and covering said upper trench sidewalls of said trenched gates wherein said Schottky junction barrier layer is in direct contact with said source region through said upper trench sidewalls and top surface of said source region for expanding three-dimensional (3D) current conducting surfaces to said source regions.

18. The semiconductor power device of claim 17 wherein:
said trenched gates partially filled with a said polysilicon therein and each of said trenched gates is padded with a gate insulation layer covering a lower portion of said trenched sidewalls below said upper trench sidewalls having a greater thickness on a bottom surface of the trenches than the gate insulation layer padded along sidewalls of the trenches.

19. The trenched semiconductor power device of claim 17 further comprising:
a higher-concentration body-dopant region disposed next to a source region encompassed in each of the body regions for reducing a contact resistance of the body regions for improving a device ruggedness.

* * * * *